United States Patent [19]

Kessler et al.

[11] Patent Number: 5,691,991

[45] Date of Patent: Nov. 25, 1997

[54] PROCESS FOR IDENTIFYING DEFECTIVE INTERCONNECTION NET END POINTS IN BOUNDARY SCAN TESTABLE CIRCUIT DEVICES

[75] Inventors: Brian Robert Kessler, Lagrangeville, N.Y.; Edward Everett Horton, III, Westford, Vt.

[73] Assignee: International Business Machines Corporation, Armonk, N.Y.

[21] Appl. No.: 789,857

[22] Filed: Jan. 28, 1997

Related U.S. Application Data

[63] Continuation of Ser. No. 384,859, Mar. 17, 1995, abandoned.

[51] Int. Cl.$^6$ .................................................. G01R 31/28
[52] U.S. Cl. .................. 371/22.3; 371/25.1; 395/183.01
[58] Field of Search .............................. 371/22.3, 22.1, 371/25.1, 27, 21.6; 364/488, 489, 551.01; 395/183.01

[56] References Cited

U.S. PATENT DOCUMENTS

| | | | |
|---|---|---|---|
| 4,766,595 | 8/1988 | Gollomp | 371/23 |
| 4,841,456 | 6/1989 | Hogan, Jr. et al. | 364/550 |
| 4,847,795 | 7/1989 | Baker et al. | 364/579 |
| 5,001,714 | 3/1991 | Stark et al. | 371/26 |
| 5,027,353 | 6/1991 | Jarwala et al. | 371/27 |
| 5,043,987 | 8/1991 | Stark et al. | 371/26 |
| 5,046,034 | 9/1991 | Stark et al. | 364/580 |
| 5,103,450 | 4/1992 | Whetsel | 371/22.1 |
| 5,130,936 | 7/1992 | Sheppard et al. | 364/551.01 |
| 5,260,947 | 11/1993 | Posse | 371/22.3 |
| 5,291,495 | 3/1994 | Udell | 371/22.3 |
| 5,303,246 | 4/1994 | Anderson et al. | 371/22.3 |
| 5,444,715 | 8/1995 | Gruetzner et al. | 371/22.3 |
| 5,493,504 | 2/1996 | Minato | 364/488 |

OTHER PUBLICATIONS

IBM Technical Disclosure Bulletin, AC Interconnect Test With Series Boundary Scan by P.K. Graham; vol. 34 No. 6, Nov. 1991, pp. 325–330.

IBM Technical Disclosure Bulletin, Method and Design for Applying Stuck Faults in an LSSD Boundary Scan Environment by S.M. Douskey; vol. 34 No. 10B, Mar. 1992, pp. 444–446.

IBM Technical Disclosure Bulletin, Method to Verify Chip–To–Chip Interconnect Within a Hardware System by L.B. Arimilli, J.I. Barreh & R.T. Golla; vol. 36 No. 06A, Jun. 1993, p. 437.

IBM Technical Disclosure Bulletin, Open–Short Circuit Self Test by A.L. Chin & L.D. Nguyen; vol. 36 No. 06B, Jun. 1993, pp. 145–146.

IBM Technical Disclosure Bulletin, Boundary Walking Sequences for Circuit Board Interconnect Test by J.C. Chan, W.T. Chen & S. Pan; vol. 36 No. 11, Nov. 1993, pp. 19–22.

IBM Technical Disclosure Bulletin, New Algorithm for Identification of Interconnect Wiring Defects by J.C. Chan, W.T. Chen & S. Pan; vol. 36 No. 11, Nov. 1993, pp. 621–622.

*Primary Examiner*—Hoa T. Nguyen
*Assistant Examiner*—Nadeem Iqbal
*Attorney, Agent, or Firm*—DeLio & Peterson, LLC; Peter W. Peterson; Aziz M. Ahsan

[57] ABSTRACT

A process for diagnosing test result data produced during boundary scan testing of a circuit device having a plurality of boundary scan latches at endpoints interconnected in a plurality of nets. The process identifies the particular endpoint that is defective out of all the endpoints in a defective net so that a repair can be efficiently directed to the identified endpoint. The process looks for recognizable patterns of failures in failure data resulting from each test pattern in a boundary scan test, particularly the symptom pattern of a failed endpoint that fails to drive all other endpoints on the net when acting as a driver and fails to receive data from all other endpoints when acting as a receiver.

18 Claims, 8 Drawing Sheets

PROCESS FOR IDENTIFYING DEFECTIVE INTERCONNECTION NET END POINTS IN BOUNDARY SCAN TESTABLE CIRCUIT DEVICES

This is a continuation of application Ser. No. 08/384,859 filed on Mar. 17, 1995, now abandoned.

BACKGROUND OF THE INVENTION

1. Field of the Invention

This invention relates to methods of identifying and repairing defective interconnections, junctions and circuit pathways in circuit devices that are designed with boundary scan latches. More specifically, the invention relates to a process of analyzing test result data produced during boundary scan testing to determine which specific endpoint from among a net of interconnected endpoints is defective so that a repair can be directed to only that endpoint.

2. Description of Related Art

In multi-device packages, such as multi-chip modules (MCMs), single chip modules (SCMs), printed circuit boards (PCBs), and VLSI devices, it is important to verify that the electrical connections between discrete devices in the package are good. In devices with many interconnections, that task can be quite involved and time consuming. However, the importance of such testing becomes even greater with such packages, as the opportunity for error increases with the increased number of chip input/output (I/O) connections. To facilitate such interconnect testing, boundary scan technology is used.

Boundary scan technology involves designing a boundary scan latch into the circuit device at each I/O. This latch provides a steady-state observable point into which test application data can be loaded, and test result data can be unloaded. The boundary scan latch is a circuit which is capable of propagating data through two mutually exclusive paths, each path controlled by separate sets of clocks. One set of clocks is used to shift data through the latches, which are connected together in a chain throughout the chip, thereby loading or unloading the chain. The other clocks are used to perform the actual functional operations of the package, propagating data through the latches normal system paths.

In one type of circuit device for which this testing process is used, multiple circuit elements (chips) are mounted on a common substrate of the circuit device. The chips have I/O's that are connected to one another and to I/O's of the circuit device through circuit pathways formed on (or in) one or more levels of the substrate. The web of interconnections that transfers signals between the various chips and between the circuit device and the rest of the world must be tested to verify that it is good. Failures can occur at many different interconnection points, including in the boundary scan latches, in junctions between the chips and the substrate and in the circuit pathways of the substrate. The test performed to identify such failures is the stuck drivers boundary scan test.

The network of connections on a circuit device is considered in boundary scan testing to be organized into a set of electrical interconnection nets. Each net includes a set of endpoints that are directly electrically connected together. The endpoints on a single net include all the I/O's on the chips and all the I/O's of the circuit device that are directly connected internally or through the circuit pathways of the substrate. If two endpoints (chip I/O or circuit device I/O) are directly connected to each other, they are on the same net, if not, they are on different nets.

Present techniques employ boundary scan testing to identify only the defective net, not the specific endpoint that is defective. This is done by driving each net on the circuit device with a series of test patterns. In each test pattern, one of the endpoints on the net acts as a driver and drives the other endpoints on the net with a logic 0 or a logic 1. The net is tested with different patterns until each endpoint has driven its net. The data received at the endpoints of the net for each test pattern is examined to determine if the same value was received as was used to drive the net. If the expected value was not received, a failure has occurred, and the failed endpoint and the test pattern used to cause the failure are entered into the resulting test result data for subsequent analysis and use during repair of the circuit device.

Because a failure item is entered into the test result data during the boundary scan test whenever an endpoint fails to receive expected data, many of the failure items in the test result data actually identify good endpoints that did not receive data from defective endpoints. Thus, there are many more failure items in the resulting test result data than there are actual physical defects. For example, when a connection to an endpoint is defective, that endpoint will typically show up as a failure in the test result data each time one of the other endpoints in the same net tries to drive it. However, good endpoints in the same net will also show up as failures in the test result data whenever the failed endpoint tries to drive them. Other types of failures can generate other types of multiple or single failure entries in the test result data.

Accordingly, the principal prior art method of analyzing boundary scan test result data has been to review the test result data and, by means of a net lookup table, identify the net that the endpoint listed in each failure entry belongs to. In this way, the multiple endpoint entries in the failure data are reduced to a list of failed nets and a repair call is generated for each failed net.

However, when the only information provided for the repair is that the net is defective, the repair is time consuming and inefficient, because many good endpoints on the net must be serviced even though only one endpoint may be defective. This has been sufficient in the past for small sub-assemblies. However, with the advent of, and rapid proliferation of larger multi-chip modules and boards, and the implementation of boundary scan, greater diagnostic efficiency is required . . . and is possible. What has been needed is a method of identifying the specific defective endpoint on the net so that the repair can be directed to the site of the defect.

The present invention meets this need by using additional information generated during the boundary scan testing process to identify with a high probability the specific endpoint that is causing the net to fail the boundary scan test. Thus, the process of the present invention generates a repair call to a specific endpoint of the net whereas prior art methods have generated a repair call for the entire net.

Bearing in mind the problems and deficiencies of the prior art, it is therefore an object of the present invention to provide a method of analyzing boundary scan test result data to identify a failed endpoint from among a plurality of endpoints in a net.

A further object of the invention is to reduce repair and rework time by directing a repair call to the specific endpoint location of the failure.

Still other objects and advantages of the invention will in part be obvious and will in part be apparent from the specification.

SUMMARY OF THE INVENTION

The above and other objects, which will be apparent to those skilled in the art, are achieved in the present invention which is directed to a process for diagnosing test result data produced during boundary scan testing of a circuit device having a plurality of endpoints interconnected in a plurality of nets. Broadly described, the process includes identifying which endpoints are connected to each endpoint that has failed (i.e., all the members of a single net exhibiting a failure), identifying the test pattern that was used during that failure (and thus the endpoint that was acting as the driver during that failure) and then analyzing the symptom pattern of endpoint failures that occurred during that test pattern (i.e., which endpoints failed, and which did not) to determine the cause of the failure. Different causes generate different symptom patterns of entries into the failure data, and these symptom patterns can be used to detect the failed endpoint with a high degree of confidence.

In the preferred process, a first pass through the failure data is used to assign failure priorities to each endpoint on a net, and to the net itself, for each test pattern that was used. A second pass through the data analyzes the failure priorities to identify the most likely endpoint causing the failure.

BRIEF DESCRIPTION OF THE DRAWINGS

For a fuller understanding of the invention, reference should be made to the following description taken in connection with the accompanying drawings, in which.

DESCRIPTION OF THE PREFERRED EMBODIMENT(S)

Figure 1:
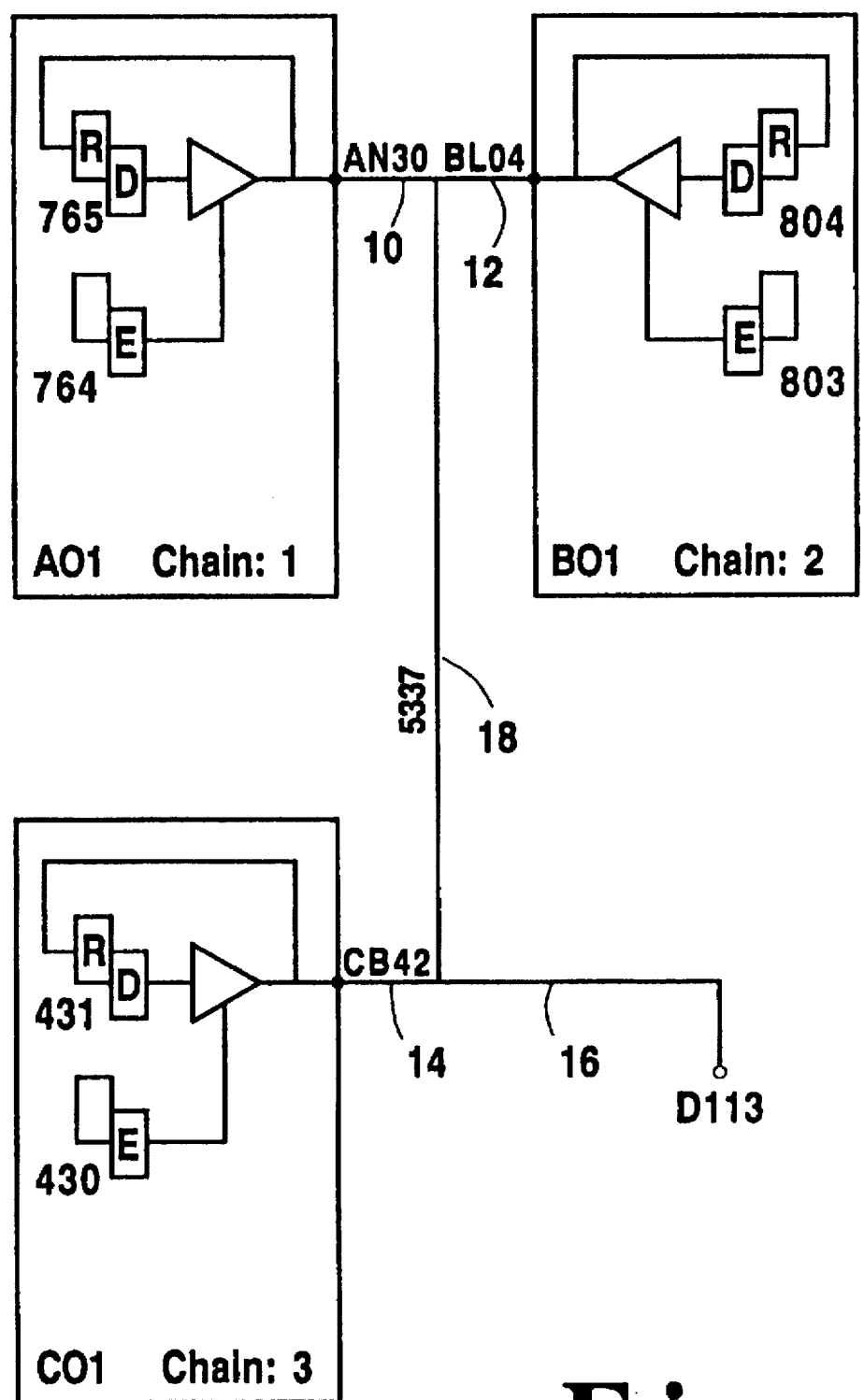
FIG. 1 is a circuit diagram of a representative portion of a circuit device testable with boundary scan techniques showing a single net composed of three chip I/O endpoints and a module I/O.

In describing the process of the present invention, reference will be made herein to FIG. 1 which shows a portion of a typical prior art circuit device designed with boundary scan latches so that it is testable with boundary scan techniques. The portion shown is a single interconnection net, referenced as net 5337. Net 5537 connects three chips, A01, B01 and C01 to each other and to I/O D113 of the circuit device, through pathways 10, 12, 14, 16, 18 on or in a substrate. Net 5337 is composed of four endpoints, including three chip I/O's (AN30, BL04 and CB42), and one module I/O (D113).

Each of the chips (A01, B01 and C01) includes a boundary scan latch having a receiver/driver portion (765, 804 and 431, respectively) and an enable portion (764, 803 and 430, respectively). During boundary scan testing, the I/Os of the circuit device (such as I/O D113) are also connected to comparable latches capable of driving the net with logic data and receiving data from the net when driven by other endpoints on the net.

During the testing phase, each endpoint (AN30, BL04, CB42 and D113) is used to drive the net with a logic 0 and logic 1. An endpoint is enabled to drive the net by loading the desired driver enable latch portion (764, 803 and 430) with an enabling signal. The loading is accomplished by shifting the appropriate data into that driver's data and enable latches through the device's scan path. Next, the system clocks are applied to capture the data on the net into the receiving endpoints. With four endpoints, each being enabled to drive the net with a logic 0 and logic 1, there are 8 test patterns used during the testing of this network (see Table 3).

During each test pattern, one of the endpoints on the net will act as a driver, and all of the remaining endpoints will attempt to receive the data. If the driven data is received by each latch in each case, the net is good. By comparing the received value at each latch to the expected value driven onto the net during each test pattern, potentially defective endpoints are detected. Each failed comparison is entered as an item of failure data into the failure list comprising the boundary scan test result data, and each item of failure data identifies the endpoint where the failure occurred and the test pattern used during the failed test.

The present invention uses information that is available in the test result data, beyond the information used in prior art methods of analysis, to not only identify the defective net, but also the specific defective endpoint on the net. The additional information is found in the symptom pattern of failure entries in the resulting test result data produced during the boundary scan testing. Known types of defects result in failure symptom patterns in the test result data that can be predicted in advance and automatically identified through the process of this invention to pinpoint the endpoint causing the failure on the net.

A brief example will illustrate one type of endpoint failure that can be recognized in the test result data. If endpoint BL04 is defective, perhaps because the junction between the chip I/O and the substrate pathway 12 is bad or the pathway 12 itself is open, a distinctive pattern of entries, i.e., the symptom pattern, occurs in the resulting failure test data during the boundary scan test. During the test pattern in which latch 804 attempts to drive the net 5337 with a logic 1, the receiver latches 765, 431 and at I/O D113 will fail to receive the data. This will generate three entries in the boundary scan test result data corresponding to the failed matches between what was expected and what was actually received. When test patterns are used in which one of the other three endpoints (D113, CB42 and AN30) is used to drive the net, the receiving portion of latch 804 will fail to receive the data, thereby generating an additional three failure entries in the test result data, one for each additional endpoint that fails to drive the defective endpoint.

It should be noted that the boundary scan latches shown in FIG. 1 are bidirectional, and the driver portion of each latch (identified with a D) is capable of driving the receiver portion of the same latch (identified with an R) through an internal pathway that does not rely upon the net.

Thus, even if endpoint BL04 is defective, the driver portion of 804 is capable of driving its own receiver portion directly. Because the data in a receiver portion can be read even when the receiver driver is driving the net, the bi-directional feature provides another type of failure symptom pattern that can be recognized in the test result data. A failure symptom pattern in which a driver is unable to drive its own receiver is most likely to be a failed driver, whereas a failure symptom pattern in which a driver is unable to drive other receivers on the net, but can successfully drive its own receiver is most likely to be a failed connection between the driver and the rest of the net.

The boundary scan latches, however, do not need to be provided with this bi-directional capability for the process of the invention to be used, and where it is not provided, failure analysis will simply stop after identifying the failed endpoint. In this case, the cause of the defect, failed driver or failed interconnect, will be identified and corrected during repair.

Other types of failures, such as failure of the enable latch portion will generate other distinctive symptom patterns in the test result data resulting from the boundary scan test. The process of this invention may be implemented with embodiments that identify many different types of failure symptom patterns so as to give the maximum information for the subsequent repair as to the identity of the failed endpoint. Alternatively, only the most common defects may be identified. These failure symptom patterns can be identified in an automated way to specifically locate with a high probability the location of the failed endpoint.

The diagnostic process of the invention uses the following items of information in the boundary scan test result data:

1. failure data including a list of the endpoints that failed the comparison between the expected value and the received value and an identification of the test pattern used during the failed test,
2. net layout data including a list of the endpoints on each net, and
3. test pattern data including identification of the endpoint acting as driver during each test pattern.

The process of the invention includes the following steps:

selecting from the test result data a first endpoint that failed to produce an expected test value during a failed boundary scan test;

determining a first test pattern used during the failed boundary scan test of the first endpoint;

identifying additional endpoints interconnected in a first net to the first endpoint;

identifying a specific one of the endpoints in the first net as the driving endpoint in the first test pattern;

determining from the test result data if endpoints interconnected in the first net to the driving endpoint are listed in the test result data as failed during the boundary scan test using the first test pattern; and identifying the driving endpoint in the first net as a defective endpoint if the endpoints interconnected in the first net to the driving endpoint are listed in the test result data as failed during the boundary scan test using the first test pattern.

Generally, the steps of the process will be repeated for each item of failure data corresponding to each test pattern, on a pattern-by-pattern basis, until each item of failure data, each test pattern and each net has been processed. In the preferred embodiment of the invention, the step of identifying the driving endpoint in the first net as a defective endpoint is performed by assigning failure priorities to the driving endpoints during an analysis of each test pattern used on each net.

A more specific embodiment of the invention implements the following steps:

entering items of test pattern data into a pattern description data structure, each item of test pattern data identifying a particular endpoint enabled to drive during a corresponding test pattern;

entering items of net layout data into a net layout data structure, each item of net layout data identifying a net of interconnected endpoints;

entering items of failure data into a failure description data structure, each item of failure data identifying an endpoint that failed to produce an expected test value during a boundary scan test and a corresponding test pattern used during the failed boundary scan test;

processing the failure description data structure for each test pattern in the pattern description data structure used in testing a first net, said processing including;

identifying from the pattern description data structure a specific one of the endpoints in the first net as the driving endpoint in the test pattern being processed, identifying from the net layout data structure all endpoints interconnected in the first net, determining from the failure description data structure if the endpoints interconnected in the first net to the driving endpoint are listed in the failure description data structure as failed during the boundary scan test using the test pattern being processed, assigning failure priorities to the first net and to the endpoints interconnected in the first net for the test pattern being processed based upon predetermined priorities selected according to the symptom pattern of failures of the endpoints in the first net as listed in the failure description data structure, repeating the processing until all test patterns in the pattern description data structure used in testing the first net have been processed; and generating a failure report based upon the assigned priorities.

In the preferred embodiment, the analysis is performed in two distinct passes. In the first pass, the failure data is analyzed for each test pattern used and failure priorities are assigned to the endpoints based on the likelihood that the particular endpoint has failed. In the second pass, the failure priorities are analyzed for each net to identify the specific endpoint that has failed.

The process described above is particularly effective at identifying failed interconnects between the chip and the substrate where the boundary scan latch on the chip fails to receive data from all other endpoints on its net and all the other endpoints fail to receive data from the chip. However, in the most highly preferred embodiment, used with circuit devices incorporating bi-directional I/Os, the process also identifies other types of failures, such as enable latch failures and failures of the driver portion of a latch where the internal receiver fails to receive the expected data.

The most highly preferred embodiment, incorporating all of the fault identification features in a two pass analysis method, includes a set of data structures which are arranged and automatically analyzed as described below.

Data Structures

The data required to diagnose interconnect defects and locate the failing endpoints includes the failure data, the net layout data, and the test pattern data. In the preferred process, they are organized into data structures, and the following steps are used. The data may be previously obtained in the boundary scan testing and reorganized for the process, or the process of this invention may be incorporated into the complete boundary scan test and the data organized in the desired manner as it is collected.

1. The failure data for each failure (i.e., the list of boundary scan latches that fail to receive the expected data) and the test pattern number identifying the test pattern used during each failure are entered into a failure description data structure in diagnostic software implementing the process. The failure data is organized by test pattern number identifying the test pattern used during the failure. The data structure and the diagnostic software are preferably implemented in a commercially available programming language, such as C or $C^{++}$ for use in a digital computer. One example of such a failure description data structure is shown below. An example of the data that such a structure might contain for a failure of the BL04 endpoint is shown in Table 1.

```
struct endpoint_list
    {long           chain_id;
    long            latch_position;
    long            module_io[5];
    char            fail_data_value;
    struct endpoint_list   *next_endpoint_ptr;
    }ENDPOINT_LIST, *endpoint_ptr, *temp_endpoint_ptr;
struct pttn_data
    {long           pttn_number;
    struct endpoint_list   *first_endpoint_ptr;
    struct pttn data       *next_pttn_ptr;
    }PTTN_DATA, *faildesc_addr, *pttn_data_ptr;
        *temp_pttn_data_ptr;
A failure description data structure.
```

TABLE 1

An example of failure data

| PATTERN NUMBER | CHAIN ID | LATCH POSITION | MODULE I/O | FAILING DATA VALUE |
|---|---|---|---|---|
| 2 | 2 | 804 | — | 0 |
| 4 | 1 | 765 | — | 0 |
| 4 | 3 | 431 | — | 0 |
| 4 | — | — | D113 | 0 |
| 6 | 2 | 804 | — | 0 |
| 8 | 2 | 804 | — | 0 |

For automated processing, the endpoint needs some form of identifying number. In the example described, the endpoint may be identified by either the CHAIN_ID and LATCH_POSITION of the boundary scan latch associated with it, or by the package I/O pin, as appropriate.

2. Every boundary scan latch is associated with a net endpoint. The diagnostic program must be able to retrieve the complete layout of the net that each failing boundary scan latch is on, including a list of all the endpoints on each net having a failure. This information is stored in a net layout data structure. A preferred implementation of such a data structure is shown below. An example of the data that such a structure might contain for net 5337 (containing the BL04 endpoint) is shown in Table 2.

```
struct endpoint_list
    {long           chain_id;
    long            srl_pos;
    char            L1_type;
    char            L2_type;
    char            chipsite[3];
    char            chip_io[4];
    char            driver_flag;
    char            fail_flag;
    char            driver_fail_flag;
    void            *first_priority_ptr;
    struct endpoint_list   *next_endpoint_ptr;
    }ENDPOINT_LIST, *endpoint_ptr, *temp_endpoint_ptr;
struct netlist
    {long           netid;
    void            *first_priority_ptr;
    struct endpoint_list   *first_endpoint_ptr;
    struct netlist         *next_net_ptr;
    }NETLIST, *net_ptr, *temp_net_ptr;
struct net_layout_structure
    struct netlist         *first_net_ptr;
    }LAYOUT, *layout_addr;
A net layout data structure.
```

TABLE 2

An example of net layout data

| NETID | CHAIN ID | LATCH POS | CHIP SITE | I/O PIN | L1 TYPE | L2 TYPE |
|---|---|---|---|---|---|---|
| 5337 | — | — | I/O | D113 | — | — |
|  | 1 | 765 | A01 | AN30 | R | D |
|  | 1 | 764 | A01 | AN30 | — | E |
|  | 2 | 804 | B01 | BL04 | R | D |
|  | 2 | 803 | B01 | BL04 | — | E |
|  | 3 | 431 | C01 | CB42 | R | D |
|  | 3 | 430 | C01 | CB42 | — | E |

3. For all endpoints on the failing nets, the diagnostic program must be able to identify which endpoint on each net was enabled to drive during each test pattern that produced a failure. This test application information is stored in a pattern description data structure. An implementation of such a data structure is shown below. An example of the test pattern data that such a structure might contain for tests of the net 5337 in FIG. 1 is shown in Table 3.

```
struct endpoint_list
    {long           chain_id;
    long            latch_position;
    char            module_io[5];
    struct endpoint_list   *next_endpoint_ptr;
    }ENDPOINT_LIST, *endpoint_ptr, *temp_endpoint_ptr;
structure pattern_info
    struct endpoint_list   *first_endpoint_ptr[x];
    }PATTERN_INFO, *pattern_info_addr;
```

A pattern description data structure. The array size of x is determined by the number of patterns that are used to perform the testing.

TABLE 3

An example of test pattern data

| CHAIN ID | LATCH POSITION | MODULE I/O | PATTERN NUMBER | DATA VALUE |
|---|---|---|---|---|
| 1 | 765 | — | 1 | 0 |
| 1 | 765 | — | 2 | 1 |
| 2 | 804 | — | 3 | 0 |
| 2 | 804 | — | 4 | 1 |
| 3 | 431 | — | 5 | 0 |
| 3 | 431 | — | 6 | 1 |
| — | — | D113 | 7 | 0 |
| — | — | D113 | 8 | 1 |

4. This concludes the data gathering and organizing portion of the process of the invention. After the data is gathered and organized as described above, it is analyzed by the diagnostic portion of the software program implementing the process to extract information identifying the location of each failure.

Diagnostic Algorithm

The software diagnostic portion of the preferred embodiment of the process utilizes two passes through the data that was previously collected and organized. The first pass analyzes and draws certain conclusions about the likely cause of fails for each failing pattern, on a pattern-by-pattern basis. The second pass uses the results of the first pass to analyze the fails on a net-by-net basis, taking the results from all patterns into consideration. The second pass analyzes failure priorities assigned during the first pass to identify with a high precision the specific failing endpoint so as to generate a repair call identifying the exact portion of the circuit device needing repair.

The sequence of steps in the preferred diagnostic implementation is:

Pass 1

1. Step through the failure description data structure, which is organized by failing pattern number.

2. Under each failing pattern is a list of latches failing for that pattern. Step through the failing latches, and for each one, scan the net layout data structure to locate the net that the latch is associated with.

3. Once the net is located, check to see if the failing latch is an enable latch. This is done by checking the L1_TYPE and L2_TYPE fields (see the example in Table 2) for a flag indicating an enable latch, such as 'E'.

a. If an enable latch is failing, simply flag that chip as being defective and terminate analysis on this fail. This is not a common occurrence, and in fact, is not, philosophically, a part of interconnect testing, but it is a defect mechanism that must be accounted for completeness.

b. If the failing latch is a receiver boundary scan latch, L1_TYPE or L2_TYPE will contain a flag, such as 'R', indicating this. Perform the following analyses:

1) Check all other endpoints (boundary scan latches) on the net to see if they are failing, too. This is done by looping on the endpoints in the net layout structure, and checking to see if they are present in the failure description list for the current pattern.

2) If all latches on a net fail for this pattern, then the driver endpoint is the most likely defect candidate, since none of the receivers successfully captured the data that should have been driven onto the net. It is more probable that a single driver is incapable of driving the net, rather than all individual receivers being incapable of receiving the data.

3) An extension of this all fail analysis exploits the use of bi-directional I/O's, each endpoint is capable of driving and receiving. When an endpoint is enabled to drive, it may also receive the data, but through the internal path that does not involve the chip I/O. Therefore, if the driver endpoint's own receiver fails, then the defect is assumed to be in the chip, itself. Indicate this by setting a driver_fail_flag for the driver. This will result in the driver chip being included in the repair call and being reworked, without any further analysis necessary.

4) If the receiver on the driving endpoint does not fail, then the defect must be external to the chip because the driver circuit is capable of driving to its own internal receiver.

5) Each time a potential defect is identified by pass one, linked-list entities are appended to the net layout structure entity for that net, and the defective endpoint. The linked-list entities that are added contain a failure priority value that gives the likelihood of the defect for that net or endpoint.

The priorities are assigned as follows:

If all receiver endpoints fail, then the endpoint that is enabled to drive during that pattern will get a priority of 1, and the individual receivers will get a lower priority of 2. The net, itself, will also get a priority of 1, since the defect could be on:

1. The driver chip
2. The interconnect junction
3. The substrate net

To summarize, this pass looks at each failing pattern and assigns failure priorities to the net and the endpoints for each failing pattern according to the likely cause of the failure for that pattern. The likely cause is determined by the symptom pattern of entries (i.e., which other endpoints on the net also failed or did not fail during that test pattern and which endpoint was doing the driving) that appears in the failure data. Since a fail can manifest itself differently for different test patterns (depending on whether the defective endpoint is driving or receiving during the current pattern), there will be more fails identified than are actually on the part. These pass one fails must be resolved by analyzing the fails on a net-by-net basis.

Pass Two

Once failure priorities have been added to the net layout structure entity for each net, and each endpoint, the pass two analysis determines which endpoint is actually defective. The priority values in the net layout data structure are analyzed as follows:

a. Check the priority of the net for each pattern. If the priority is zero for any pattern, then it was determined during that pattern's analysis that the net was good. Therefore, the net should not be included in the repair call. An example of how this could happen would be if a driving endpoint's wrap-back receiver failed, thereby indicating that the defect is in the driver circuit, internal to the chip.

b. Step through each endpoint on the net.

c. Check the priority of the endpoint for each pattern. If the priority is zero for any pattern, then it was determined during that pattern's analysis that the endpoint was good. Therefore, it should not be included in the repair call. The non-zero priorities for any other patterns are subsequently ignored. If, however, a non-zero priority exists for every pattern, then the endpoint is potentially defective, and a repair call must be made.

Those with skill in the computer programming arts will understand from the data structures and process description given above that the process immediately identifies in pass 1 certain types of failures. Thus, enable latch failures do not result in the assignment of failure priorities during pass 1 which are subsequently analyzed in pass 2, but instead, result in the enable latch being immediately flagged as defective for ultimate inclusion in the defect list. Other implementations of the process may use this type of shortcut, dependent upon the type of failure identified, or they may assign other levels of failure priority and wait for the pass 2 analysis to identify the type of failure.

EXAMPLE

A more specific example of how the preferred implementation analyzes the data will clarify the steps described above. Consider a discontinuity defect in the connection to chip B01, chip I/O BL04 on the portion of the circuit device depicted in FIG. 1. For such a defect, the test patterns described in Table 3 would yield the failure data shown in Table 1.

Proceeding according to the process, the preferred implementation of the diagnostic software would first obtain the layout information for the net that the failing endpoints are associated with. This net layout information is shown in Table 2.

The program will start the analysis by stepping through the failure description data structure. For each failing endpoint, the net layout structure is scanned to locate the net that the endpoint is associated with. In this example, the fist failing endpoint is identified as CHAIN_ID=2, LATCH_POSITION=804. This endpoint is on net 5337.

Current software diagnostic programs in the industry stop here, having obtained similar information from fault dictionaries that simply identify the net that is associated with every particular fault detected. In such prior art programs, the entire net is called for repair.

Diagnostic software developed to implement the present invention looks at the test pattern data to realize that for pattern #2, the failing pattern that we are analyzing, the endpoint that is enabled to drive the net is CHAIN_ID=1, LATCH_POSITION=765. This is different from the failing endpoint for this pattern. The program then checks the failure data in the failure description data structure to see if all endpoints fail during this pattern. As may be seen from Table 1, they do not, so the current failing endpoint is flagged as defective. This is indicated in software by appending a priority structure to that endpoint's record in the net layout data structure. The endpoint is identified as failing with a priority of 1 during pattern #2.

The program then steps forward to the second failing pattern in the failure description table. This is pattern #4, and has three failing endpoints. All of these endpoints are on the same net, and it is determined, by looking at the test pattern data, that the CHAIN_ID=2, LATCH_POSITION=804 endpoint is driving the net with a logic 1 during pattern 4. Since all other endpoints on the net fail during this pattern, the most likely defect is determined to be the driving endpoint, which is not capable of driving the net. This can be caused by a defective driver, a broken substrate/PCB wire, or a bad interconnect. However, since the internal 'wrap-back' receiver that has been designed into this part does not fail, then the driver circuit, itself, is determined to be functional. Therefore the remaining suspects are the net and the interconnect. Another failure priority structure entity will be added to the CHAIN_ID=2, LATCH_POSITION=804 record in the net layout table (see Table 4 below showing the completed priority assignments). This endpoint will again be flagged as failing.

As a side note, if the driving endpoint's receiver portion (the 'wrap-back' receiver) did fail, then the driver portion, itself, would be flagged as failing. In such a case, however, the fails on the other patterns would probably not occur, unless there were two separate defects: one with the driver portion, and one with the interconnect.

If the boundary scan circuitry was designed such that there is no 'wrap-back' receiver, then the diagnostics would simply stop at identifying the interconnect as being defective.

For the remaining patterns in the failure description list, the analysis would proceed in the same way as for the first failing pattern. The failing endpoint would be associated with the net shown in the net layout structure and the driving endpoint would be identified. The driving endpoint would be determined to be different from the failing endpoint, and the failing endpoint, CHAIN_ID=2, LATCH_POSITION=804, would then be flagged as defective. It is irrelevant that one of the endpoints driving the net is a module/PCB pin. If that endpoint is testable, either through the pin or with a boundary scan latch, then it is treated the same as a boundary scan chip I/O. The final net layout table, with priority structures appended is shown in Table 4.

TABLE 4

This priority scheme results from the analysis of failing patterns. The zero priorities nullify the non-zero priorities for the endpoints that had been verified as functional by those endpoints respective test patterns.

| NETID | PTTN | NET PRTY | CHAIN ID | LATCH POS | CHIP SITE | I/O PIN | L1 TYPE | L2 TYPE | PTTN | I/O PRTY |
|---|---|---|---|---|---|---|---|---|---|---|
| 5337 | 2 | 1 | | | | | | | | |
| | 4 | 1 | | | | | | | | |
| | 6 | 1 | | | | | | | | |
| | 8 | 1 | | | | | | | | |
| | | | — | — | I/O | D113 | — | — | 2 | 0 |
| | | | | | | | | | 4 | 2 |
| | | | | | | | | | 6 | 0 |
| | | | | | | | | | 8 | 0 |
| | | | 1 | 765 | A01 | AN30 | R | D | 2 | 0 |
| | | | | | | | | | 4 | 2 |
| | | | | | | | | | 6 | 0 |
| | | | | | | | | | 8 | 0 |
| | | | 1 | 764 | A01 | AN30 | — | E | | |
| | | | 2 | 804 | B01 | BL04 | R | D | 2 | 1 |
| | | | | | | | | | 4 | 1 |
| | | | | | | | | | 6 | 1 |
| | | | | | | | | | 8 | 1 |
| | | | 2 | 803 | B01 | BL04 | — | E | | |
| | | | 3 | 431 | C01 | CB42 | R | D | 2 | 0 |
| | | | | | | | | | 4 | 2 |
| | | | | | | | | | 6 | 0 |
| | | | | | | | | | 8 | 0 |
| | | | 3 | 430 | C01 | CB42 | — | E | | |

After all of the fails have been analyzed in pass 1, a repair call is generated during pass 2 by looking at the priority structures that have been appended onto the endpoint records in the net layout table. For this example, only the endpoint associated with CHAIN_ID=2, LATCH_POSITION=804 will have only non-zero priority entities appended, one for each of the four failing patterns that were analyzed, and the chip (B01) and its I/O (BL04), will be called for rework.

More complex priority list analysis would be required for other types of fails, however, this example accurately illustrates the interconnect diagnostic analysis process.

Flowchart

Figure 2A:
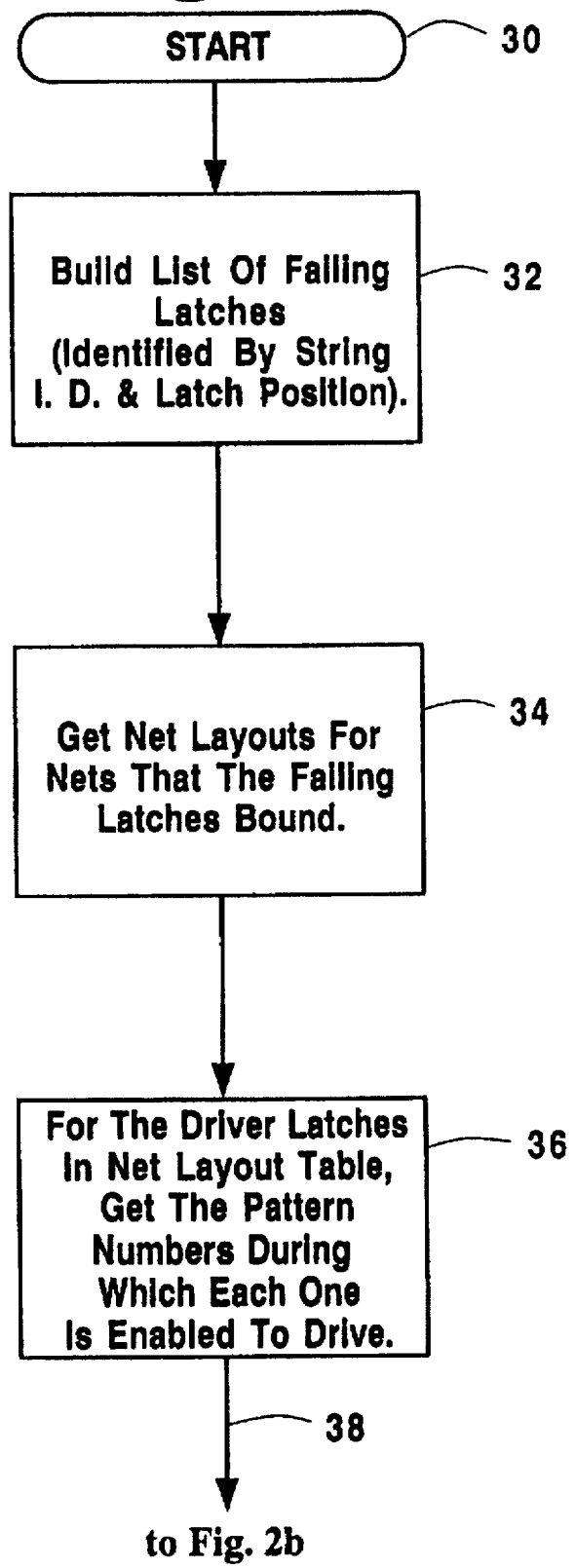
FIGS. 2a through 2g comprise a flow chart describing the flow of a computer program implementing the preferred embodiment of the invention.

FIGS. 2a through 2g provide a flowchart of a computer program implementing the preferred embodiment of the invention. Program flow begins at start block 30 in FIG. 2a and continues until done at block 280 in FIG. 2g. FIG. 2a shows the steps that gather and structure the basic data to be analyzed in the method of the invention. In block 32, the list of failing latches is assembled into the failure description table according to the failure description data structure. In block 34, the net layout data is assembled in accordance with the net layout data structure. In block 36 the driver latches for each test pattern are identified.

Figure 2B:
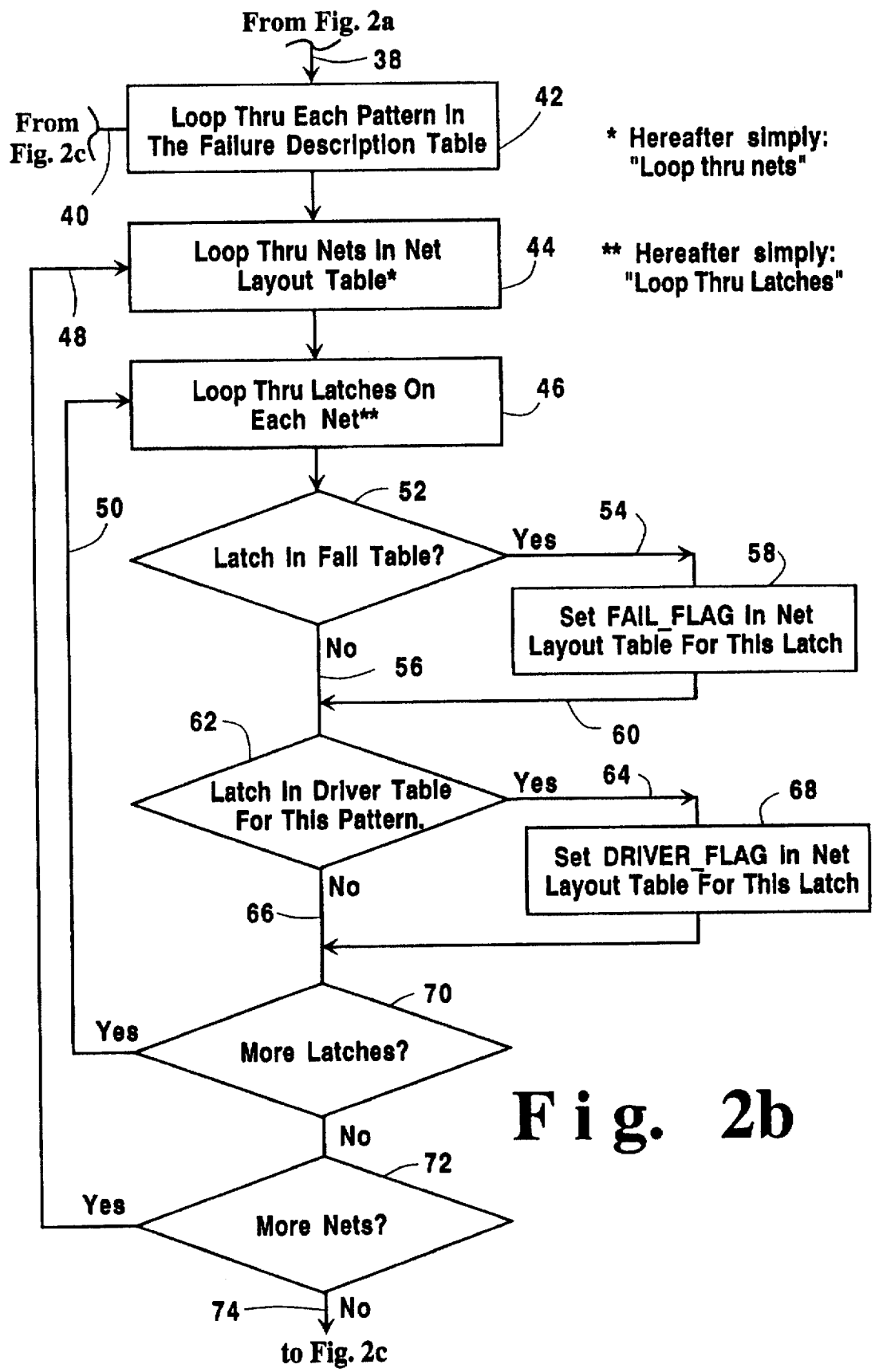

Program flow then continues to FIG. 2b on path 38. FIGS. 2b to 2e comprise the steps of Pass 1 in which priorities are assigned. FIGS. 2f to 2g comprise the steps of Pass 2 in which the priorities determined in Pass 1 are analyzed to identify the failed endpoints and issue appropriate repair calls. Block 42 is the start block of a major loop structure concluding at decision block 222 in FIG. 2e. When the last loop through this structure is done, Pass 1 is complete. Each loop through block 42 processes a particular test pattern, and looping proceeds until all the test patterns have been processed. During the major outer loop of block 42 to decision block 222, inner nested loops through the nets and the latches of each net will process each net and each latch to set flags and assign priorities.

FIG. 2b shows the steps that set flags determining which latches failed and which latches acted as drivers during each test pattern. Processing for this flag setting operation is done in the nested loop structure beginning at blocks 44 and 46, and concluding at decision blocks 72 and 70.

In the loop extending from block 46 to decision block 70, including the blocks from 52 to 68, the flag for failure (FAIL_FLAG) and the flag for driver status (DRIVER_FLAG) are set for each latch for the test pattern being processed to determine whether a latch has failed during that test pattern and whether it was the driver latch during that test pattern.

Decision block 70 determines whether all of the latches for the net under consideration have been evaluated. Decision block 72 determines if all of the nets under consideration have been evaluated. If all of the latches for all of the nets have been processed for the test pattern under consideration, then flow continues on path 74 to FIG. 2c.

Figure 2C:
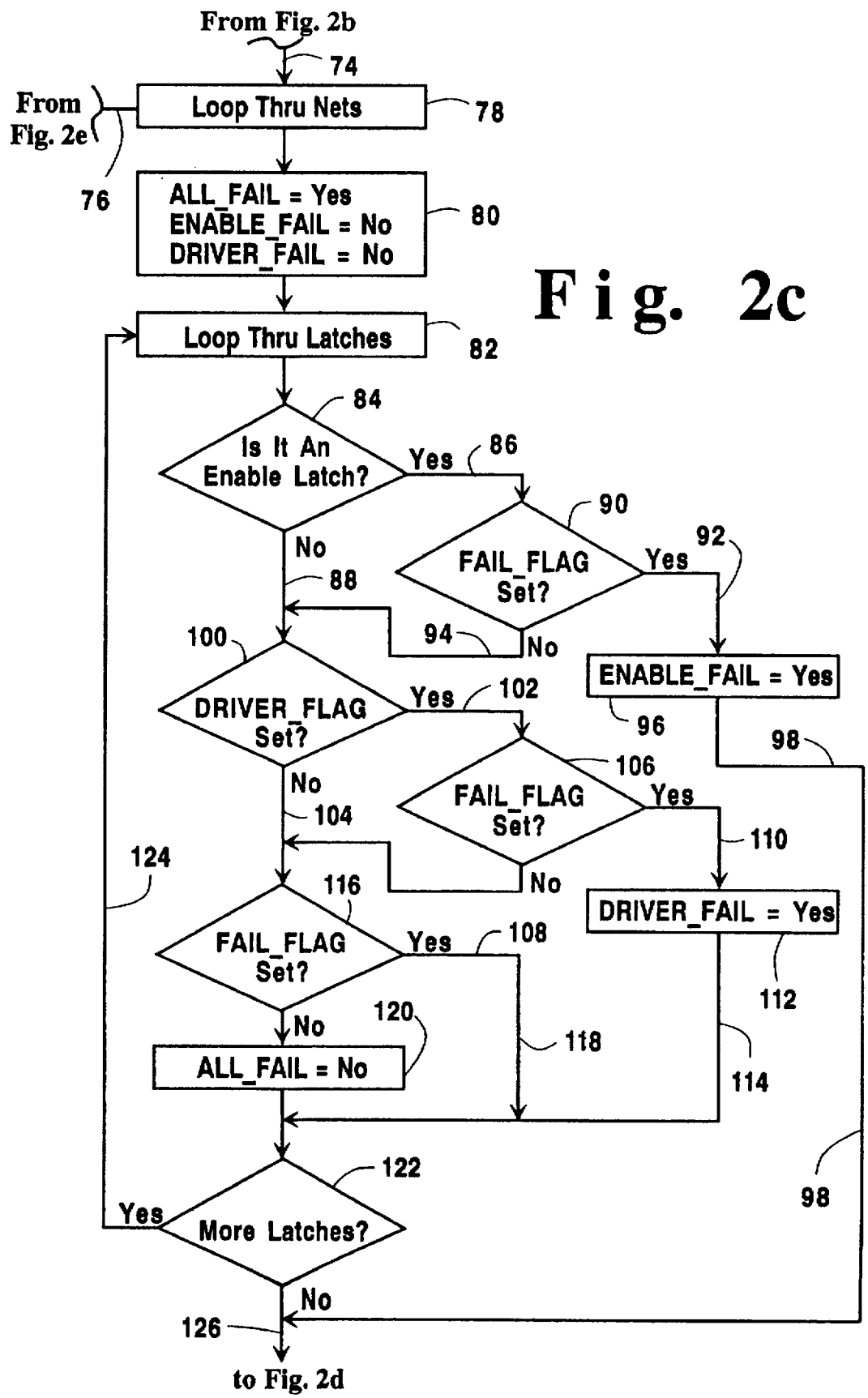

In the blocks shown in FIG. 2c, the ALL_FAIL, ENABLE_FAIL and DRIVER_FAIL flags are set. ALL_FAIL signifies that all the latches in a specified net failed during the specified test pattern. ENABLE_FAIL signifies that a failure was caused by an enable latch. DRIVER_FAIL signifies that a failure was caused by the failure of a driver latch. Processing is performed by initially setting the default flag values as shown in block 80, then changing the flags to the correct values as illustrated in blocks 82 to 122. After the evaluation of latches in blocks 82 through 122, flow continues on path 126 to FIG. 2d.

Figure 2D:
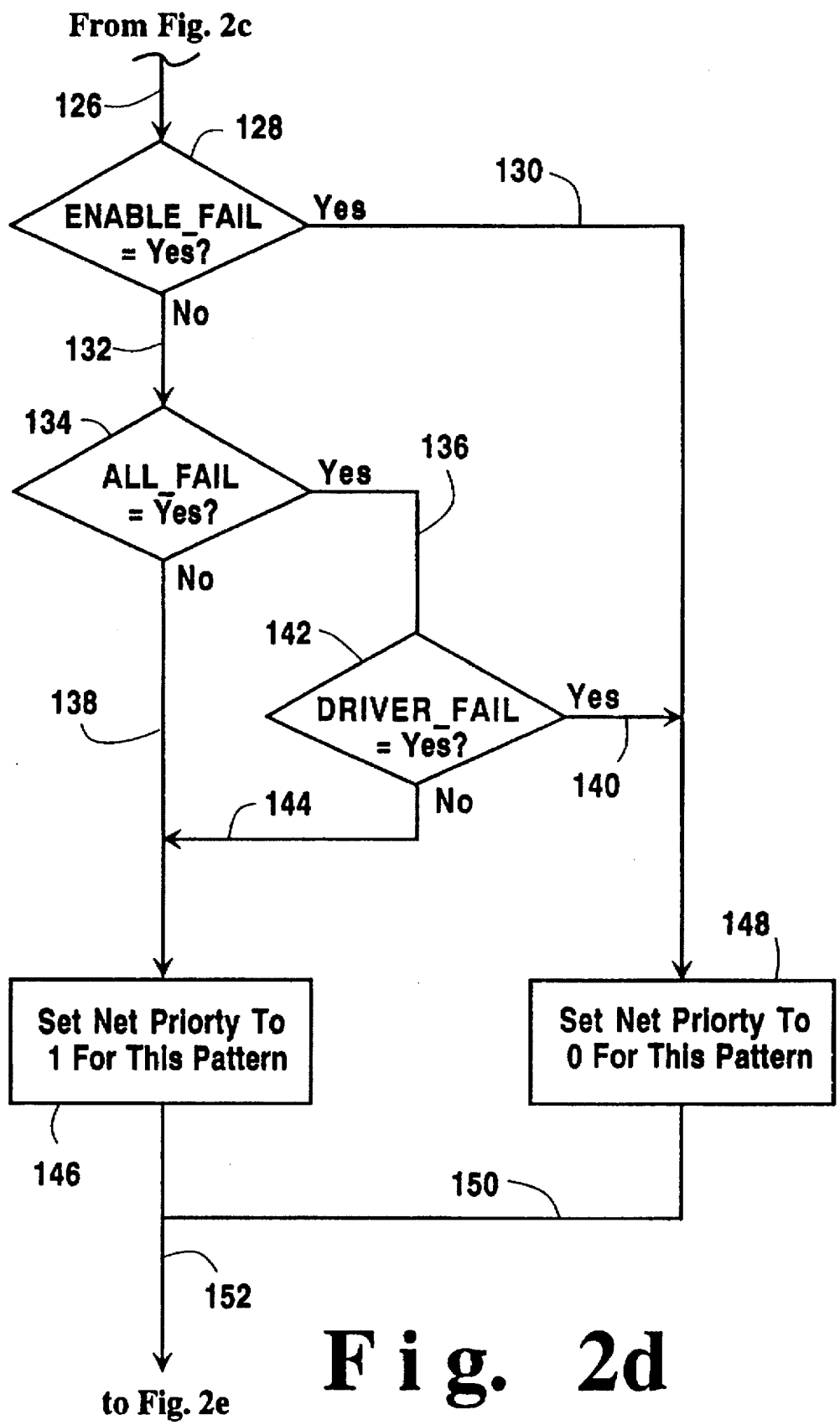

FIG. 2d shows the steps that set the net priorities in blocks 128 to 148. Net priority is set to zero in block 148 if the ENABLE_FAIL flag was previously set to YES in block 96, or if the ALL_FAIL flag remained set at YES (i.e., flow never passed through block 120) and the DRIVER_FAIL flag was set to YES, as determined in decision block 142. Otherwise, flow will continue on path 138 to block 146 where net priority is set to one and then on to FIG. 2e on path 152.

Figure 2E:
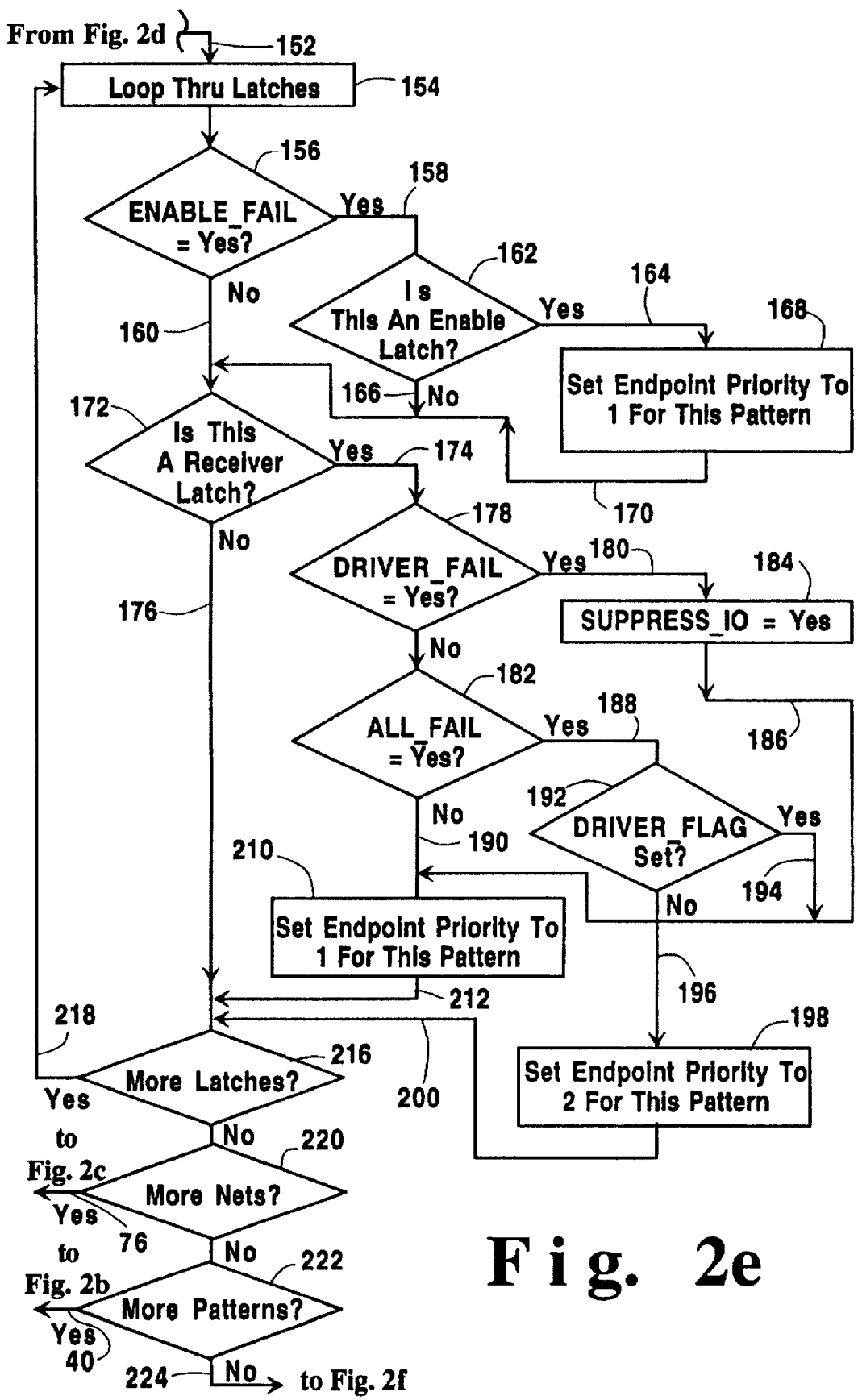
Figure 2F:
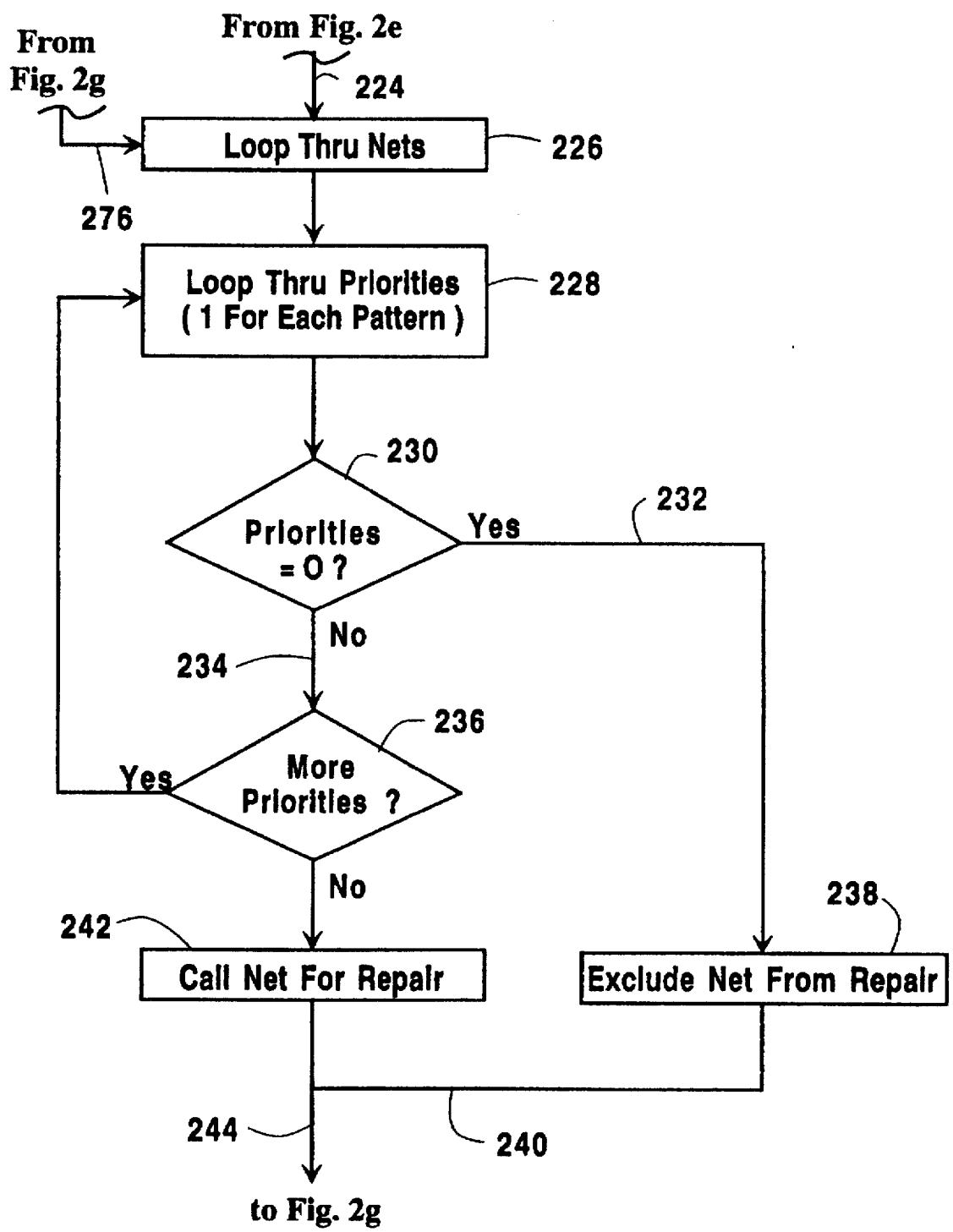
Figure 2G:
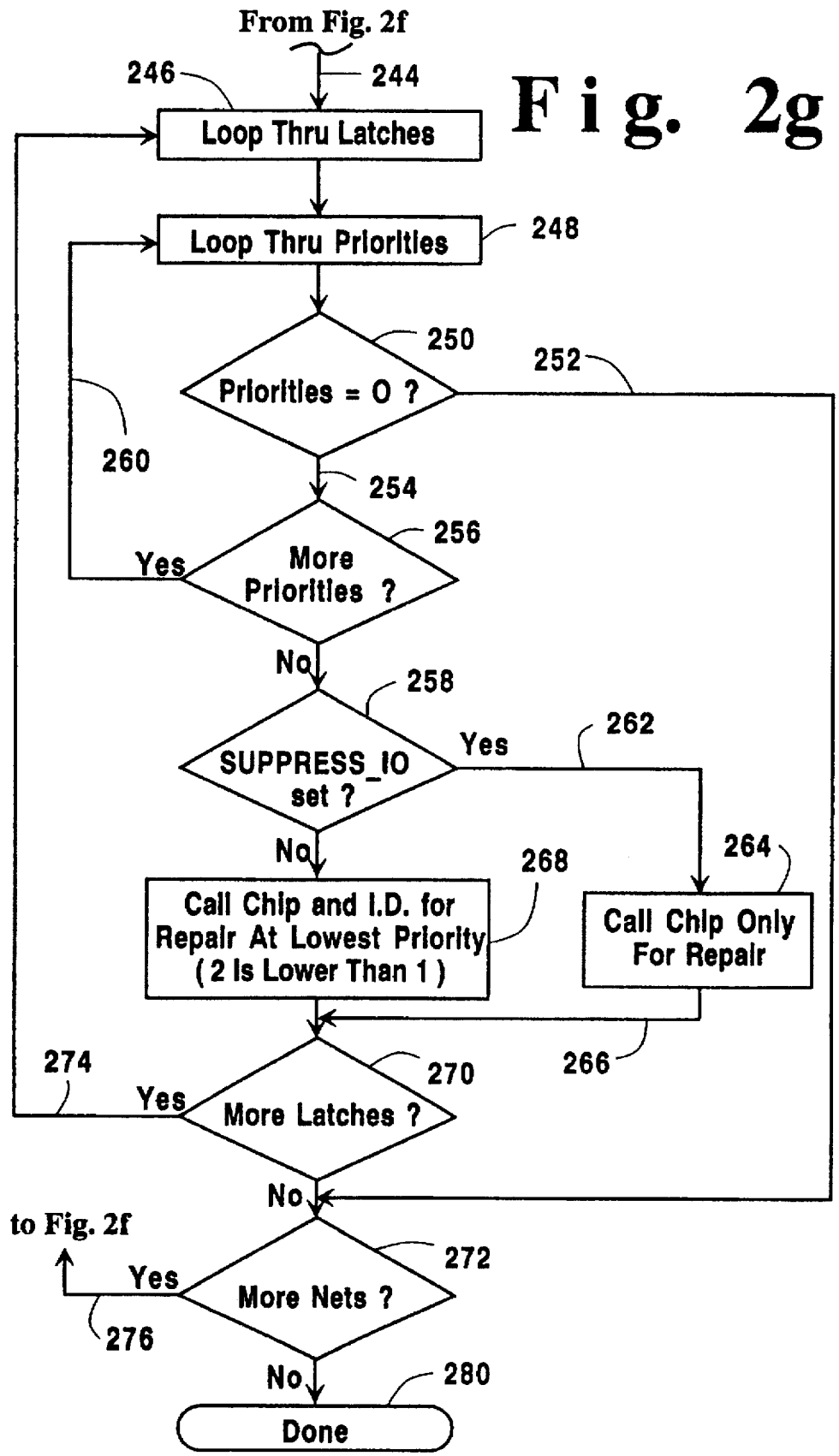

FIG. 2e shows how the endpoints are assigned a priority in the loop from blocks 154 to 216, based on the flags that were previously set. Endpoint priorities are set to one or to two in blocks 210 and 198 as shown in Table 4.

Decision block 220 concludes the loop for each test pattern that began on FIG. 2b in block 42. Once the final test pattern has been evaluated, flow proceeds on path 224 to FIG. 2f. At this point, each net and each endpoint will have received a defined priority for each test pattern. The endpoint priorities will have been set in blocks 168, 198 and 212 and the net priorities will have been set in blocks 146 and 148. The exit onto path 224 signifies the completion of Pass 1, and the initiation of Pass 2 in block 226.

In Pass 2, the significance of the priorities set in Pass 1 is determined. For each net, the net priorities are evaluated, one for each test pattern applied, and the appropriate repair calls are made. For each endpoint of each net, that endpoint's priority and the SUPPRESS_I/O flag will be evaluated and the appropriate repair call made.

In block 226, a loop begins through all nets, which concludes at decision block 272 on FIG. 2g. This loop through the nets contains a loop through the priorities of that net from blocks 228 to 236 and a loop through the latches of that net in blocks 246 to 270. During the loop through the priorities, the priorities for each failing pattern are checked, and the net is excluded from repair in block 238 only if the priority for each pattern is zero. In blocks 246 to 270, the latches are checked for each net, and in blocks 248 through 256 the priorities for each latch for each test pattern are checked. If all priorities are non-zero, then decision block 258 will be executed and the SUPPRESS_I/O flag is checked. If the flag is set, then the chip only is called for repair in block 264. If it is not set, then the chip and the I/O are called for repair at the lowest priority in block 268.

At the conclusion of the evaluation in the loop extending from block 246 to decision 270, the next net is selected in decision block 272 via path 276. If all of the nets have been evaluated, then the program is done at block 280, and all of the failed nets and endpoints will have been called for repair in accordance with the invention.

It will thus be seen that the objects set forth above, among those made apparent from the preceding description, are efficiently attained and, since certain changes may be made in the above process without departing from the spirit and scope of the invention, it is intended that all matter contained in the above description shall be interpreted as illustrative and not in a limiting sense.

Thus, having described the invention,
What is claimed is:

1. A process for diagnosing test result data produced during boundary scan testing of a circuit device having a plurality of endpoints interconnected in a plurality of nets, the process comprising:

(a) selecting from the test result data a first endpoint that failed to produce an expected test value during a failed boundary scan test;

(b) determining a first test pattern used during the failed boundary scan test of the first endpoint;

(c) identifying additional endpoints interconnected in a first net to the first endpoint, the first net including a total of at least three endpoints;

(d) identifying a specific one of the endpoints in the first net as the driving endpoint in the first test pattern;

(e) determining from the test result data if all endpoints interconnected in the first net to the driving endpoint are listed in the test result data as failed during the boundary scan test using the first test pattern;

(f) identifying the driving endpoint in the first net as a defective endpoint if all the endpoints interconnected in the first net to the driving endpoint are listed in the test result data as failed during the boundary scan test using the first test pattern; and (g) identifying the driving endpoint in the first net as a non-defective endpoint if some of the endpoints interconnected in the first net to the driving endpoint are listed in the test result data as not failed during the boundary scan test using the first test pattern.

2. The process for diagnosing test result data produced during boundary scan testing according to claim 1 further including the steps of:

(g) repeating steps (a) through (f) to identify additional defective endpoints; and (h) producing a diagnostics report listing defective endpoints.

3. The process for diagnosing test result data produced during boundary scan testing according to claim 1 further including the steps of:

(g) following step (a), determining if the first endpoint is an enable latch; and (h) listing the first endpoint as defective if the first endpoint is an enable latch.

4. The process for diagnosing test result data produced during boundary scan testing of a circuit device having boundary scan latches at net endpoints with drivers internally connected to corresponding receivers according to claim 1 further including the steps of:

(g) following step (d), determining from the test result data if the receiver corresponding to the driving endpoint is listed in the test result data as failed; and (h) listing the driving endpoint as defective if the receiver corresponding to the driving endpoint is listed in the test result data as failed.

5. The process for diagnosing test result data produced during boundary scan testing according to claim 4 wherein step (h) further comprises listing the boundary scan latch at the driving endpoint as defective if the receiver corresponding to the driving endpoint is listed in the test result data as failed.

6. The process for diagnosing test result data produced during boundary scan testing of a circuit device having boundary scan latches at net endpoints with drivers internally connected to corresponding receivers according to claim 1 further including the steps of:

(g) following step (e), determining from the test result data if the receiver corresponding to the driving endpoint is listed in the test result data as failed; and (h) listing the driving endpoint as defective at a point external to the driving latch if all endpoints interconnected in the first net to the driving endpoint are listed in the test result data as failed and if the receiver corresponding to the driving endpoint is not listed in the test result data as failed.

7. The process for diagnosing test result data produced during boundary scan testing according to claim 1 wherein during step (e) failure priorities are assigned to endpoints interconnected in the first net to the driving endpoint.

8. The process for diagnosing test result data produced during boundary scan testing according to claim 7 wherein during step (f) the failure priorities assigned during step (e) are analyzed to identify whether the driving endpoint in the first net is a defective endpoint.

9. A process for diagnosing test result data produced during boundary scan testing of a circuit device having a plurality of endpoints interconnected in a plurality of nets, the process comprising:

entering items of test pattern data into a pattern description data structure, each item of test pattern data identifying a particular endpoint enabled to drive during a corresponding test pattern;

entering items of net layout data into a net layout data structure, each item of net layout data identifying a net of interconnected endpoints;

entering items of failure data into a failure description data structure, each item of failure data identifying an endpoint that failed to produce an expected test value during a boundary scan test and a corresponding test pattern used during the failed boundary scan test;

processing the failure description data structure for each test pattern in the pattern description data structure during which a failure occurred, said test pattern processing including;

identifying from the pattern description data structure a specific one of the endpoints in the first net as the driving endpoint in the test pattern being processed, identifying from the net layout data structure all endpoints interconnected in the first net, determining from the failure description data structure if the endpoints interconnected in the first net to the driving endpoint are listed in the failure description data structure as failed during the boundary scan test using the test pattern being processed, assigning failure priorities to the endpoints interconnected in the first net for the test pattern being processed based upon predetermined priorities selected according to the symptom pattern of failures of the endpoints in the first net as listed in the failure description data structure, repeating the processing until each test pattern has been processed; and generating a failure report based upon the assigned priorities.

10. The process for diagnosing test result data produced during boundary scan testing according to claim 9 wherein the step of assigning failure priorities further includes assigning a failure priority to the first net.

11. The process for diagnosing test result data produced during boundary scan testing according to claim 10 wherein the step of assigning failure priorities includes assigning a failure priority to each net in the circuit device containing a failed endpoint listed in the failure description data structure and a failure priority to each endpoint connected to a failed endpoint listed in the failure description data structure.

12. The process for diagnosing test result data produced during boundary scan testing according to claim 10 wherein the step of assigning failure priorities includes listing the assigned failure priorities in the net layout data structure.

13. The process for diagnosing test result data produced during boundary scan testing according to claim 9 further including the steps of:

determining from the failure description data structure if an item of failure data identifies a failed enable latch; and listing each identified failed enable latch as defective.

14. The process for diagnosing test result data produced during boundary scan testing of a circuit device having boundary scan latches at net endpoints with drivers internally connected to corresponding receivers according to claim 9 further including the steps of:

determining from the failure description data structure if an item of failure data identifies a receiver corresponding to the driving endpoint; and listing the driving endpoint as defective at a point external to the boundary scan latch at the driving endpoint if all endpoints interconnected in the first net to the driving endpoint are listed in the test result data as failed and if the receiver corresponding to the driving endpoint is not listed in the failure description data structure as failed.

15. A process for diagnosing test result data produced during boundary scan testing of a circuit device having a plurality of endpoints interconnected in a plurality of nets, the process comprising:

entering items of test pattern data into a pattern description data structure, each item of test pattern data identifying a particular endpoint enabled to drive during a corresponding test pattern;

entering items of net layout data into a net layout data structure, each item of net layout data identifying a net of interconnected endpoints;

entering items of failure data into a failure description data structure, each item of failure data identifying an endpoint that failed to produce an expected test value during a boundary scan test and a corresponding test pattern used during the failed boundary scan test;

processing the failure description data structure, the pattern description data structure and the net layout data structure in two passes to identify failed endpoints, the first pass comprising test pattern processing for each test pattern generating an item of failure data in the failure description data structure, said test pattern processing including assigning failure priorities to each endpoint for each test pattern processed, said failure priorities being assigned according to the symptom pattern of failures listed in the failure description data structure, and the second pass comprising net processing for each net having a failed endpoint in the failure description data structure, said net processing including identifying a list of failed endpoints according to the failure priorities assigned in the first pass.

16. The process for diagnosing test result data produced during boundary scan testing according to claim 15 wherein the first pass identifies a symptom pattern of failures in the failure description data structure wherein a driving endpoint fails to drive other members of a net including the driving endpoint and other endpoints on the net including the driving endpoint fail to drive the driving endpoint when the driving endpoint is acting as a receiving endpoint.

17. The process for diagnosing test result data produced during boundary scan testing according to claim 15 wherein the first pass identifies a symptom pattern of failures in the failure description data structure wherein an enable latch is listed in the failure description data structure as a failed endpoint.

18. The process for diagnosing test result data produced during boundary scan testing of a circuit device having boundary scan latches at net endpoints with drivers internally connected to corresponding receivers according to claim 15 wherein the first pass identifies a symptom pattern of failures in the failure description data structure wherein a receiver corresponding to a driving endpoint is listed in the failure description data structure as not failed and all endpoints interconnected to the driving endpoint are listed in the failure description data structure as failed.

\* \* \* \* \*

UNITED STATES PATENT AND TRADEMARK OFFICE
CERTIFICATE OF CORRECTION

PATENT NO. : 5,691,991
DATED : November 25, 1997
INVENTOR(S) : Kessler et al.

It is certified that error appears in the above-identified patent and that said Letters Patent is hereby corrected as shown below:

In column 7, line 12, Please delete "PJTN" and substitute therefor -- PTTN --
In column 15, line 10, please delete "(g)" and substitute therefor -- (h) --
In column 15, line 10, please delete "(f)" and substitue therefor -- (g) --
In column 15, line 12, please delete "(h)" and substitute therefor -- (i) --
In column 15, line 17, please delete "(g)" and substitute therefor -- (h) --
In column 15, line 19, please delete "(h)" and substitute therefor -- (i) --
In column 15, line 26, please delete "(g)" and substitute therefor -- (h) --
In column 15, line 30, please delete "(h)" and substitute therefor -- (i) --
In column 15, line 34, please delete "(h)" and substitute therefor -- (i) --
In column 15, line 44, please delete "(g)" and substitute therefor -- (h) --
In column 15, line 47, please delete "(h)" and substitute therefor -- (i) --

Signed and Sealed this

Twenty-sixth Day of May, 1998

Attest:

BRUCE LEHMAN

Attesting Officer

Commissioner of Patents and Trademarks